(12) United States Patent
Kang

(10) Patent No.: US 6,836,961 B2
(45) Date of Patent: Jan. 4, 2005

(54) CERAMIC PACKAGING METHOD EMPLOYING FLIP-CHIP BONDING

(75) Inventor: Byoung Young Kang, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/751,209

(22) Filed: Dec. 30, 2003

(65) Prior Publication Data

US 2004/0154164 A1 Aug. 12, 2004

(30) Foreign Application Priority Data

Dec. 30, 2002 (KR) .................................. 10-2002-0086653

(51) Int. Cl.⁷ .................................................. H05K 3/30
(52) U.S. Cl. ............................ 29/832; 29/830; 29/841
(58) Field of Search ........................... 29/832, 825, 840, 29/830, 841

(56) References Cited

U.S. PATENT DOCUMENTS 6,674,159 B1 * 1/2004 Peterson et al. ............ 257/680
6,717,252 B2 * 4/2004 Saeki ......................... 257/686

OTHER PUBLICATIONS

Byoung Young Kang, "Method for Packaging a Semiconductor Device", U.S. patent application No. 10/751,212, filed on Dec. 30, 2003 (Atty Docket No. PIA31223/DBE/US).

* cited by examiner

Primary Examiner—Carl J. Arbes
(74) Attorney, Agent, or Firm—Andrew D. Fortney

(57) ABSTRACT

In a ceramic packaging method employing a flip-chip bonding, a gold bump is formed on a chip bond pad in a wafer and the wafer is divided into a plurality of chips by a die sawing. A Cu pattern and the gold bump are aligned on a ceramic package, thereby adhering a bottom chip to the ceramic package through the Cu pattern and the gold bump and a top chip is adhered to the bottom chip by using an adhesive, thereby forming a bottom/top chip structure of the bottom and top chip. The chip bond pad is electrically connected to the bottom chip and the top chip by interconnecting the bottom and the top chips and interconnected portions of the bottom and the top chips are encapsulated.

7 Claims, 2 Drawing Sheets

CERAMIC PACKAGING METHOD EMPLOYING FLIP-CHIP BONDING

FIELD OF THE INVENTION

The present invention relates to a packaging method of a semiconductor device; and, more particularly, a ceramic packaging method of a semiconductor device employing a flip-chip bonding.

BACKGROUND OF THE INVENTION

FIG. 1 shows a vertical sectional view for illustrating a conventional ceramic packaging process. Conventionally, a groove is formed in a ceramic body 100 and an adhesive 102 is coated on a bottom of the groove, such that a chip 106 is adhered to the groove. A gold wire 104 serves connecting the chip 106 and the ceramic body 100 in a wire bonding, wherein the gold wire 104 is connected to a Cu pattern. Then the resultant construct is encapsulated by an epoxy molding compound 108 in order to protect the gold wire 104 connecting the chip 106 to the ceramic body 100 against external environment. Thereafter, solder balls are attached to a chip bond pad (not shown) and a package assembly is completed.

However, in order to attach solder balls to the chip bond pad, the conventional packaging method involves too complicated assembly processes such as a flux printing, a solder ball attachment, an IR (infrared) reflow, a flux cleaning and the like. Further, the conventional packaging method requires high manufacturing cost. Moreover, the usage of the epoxy molding compound causes an environmental pollution by wastes thereof.

SUMMARY OF THE INVENTION

There is, therefore, an object of the present invention to provide a ceramic packaging method of a semiconductor device capable of minimizing an electrically connected distance between a chip bond pad and a chip by employing a flip-chip bonding, thereby improving operational characteristics of the semiconductor device.

In accordance with the present invention, there is provided a ceramic packaging method employing a flip-chip bonding, including the steps of: (a) forming a gold bump on a chip bond pad in a wafer; (b) dividing the wafer into a plurality of chips by a die sawing; (c) aligning a Cu pattern and the gold bump on a ceramic package and adhering a bottom chip to the ceramic package through the Cu pattern and the gold bump; (d) adhering a top chip to the bottom chip by using an adhesive, thereby forming a bottom/top chip structure of the bottom and top chip; (e) electrically connecting the chip bond pad to the bottom chip and the chip bond pad to the top chip by interconnecting the bottom and the top chips; and (f) encapsulating interconnected portions of the bottom and the top chips.

BRIEF DESCRIPTION OF THE DRAWINGS

The above and other objects and features of the present invention will become apparent from the following description of a preferred embodiment given in conjunction with the accompanying drawings, in which.

DETAILED DESCRIPTION OF THE PREFERRED EMBODIMENT

Figure 1:
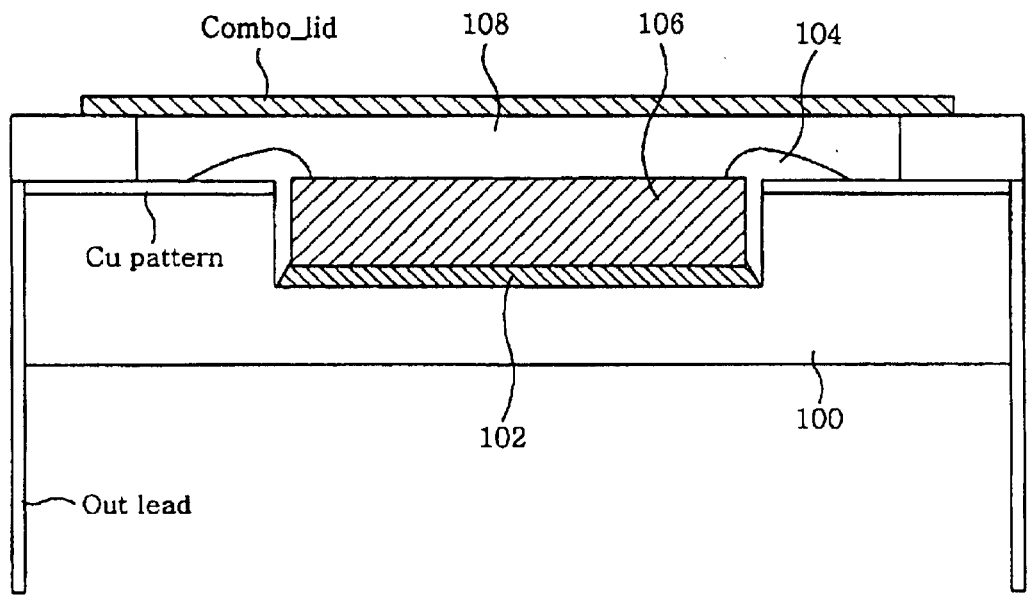
FIG. 1 shows a vertical sectional view for illustrating a conventional ceramic packaging process.
Figure 2:
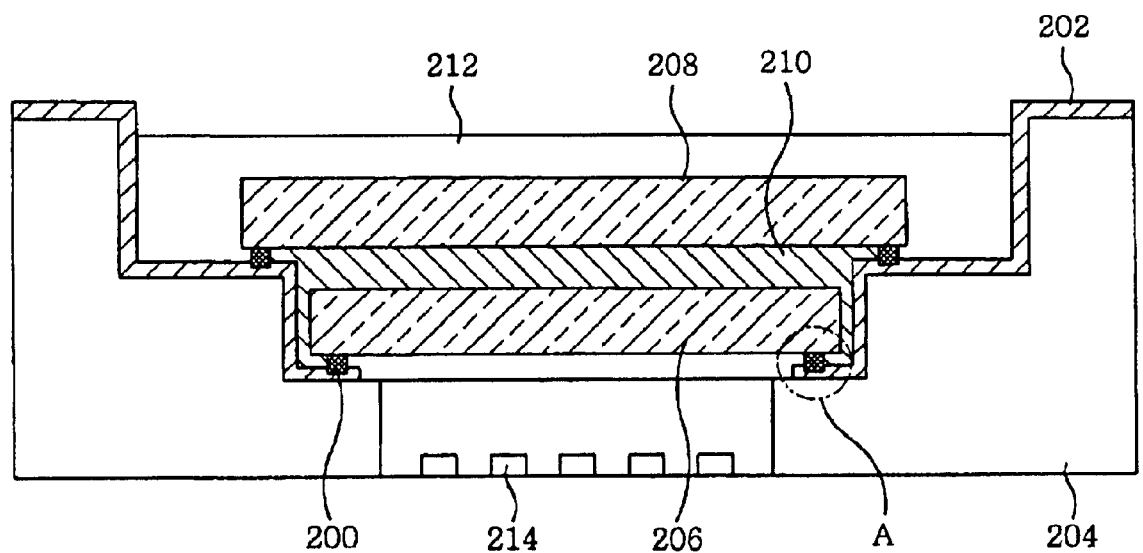
FIG. 2 depicts a vertical sectional view for illustrating a ceramic packaging process employing a flip-chip bonding in accordance with a preferred embodiment of the present invention.

FIG. 2 depicts a vertical sectional view for illustrating a ceramic packaging process employing a flip-chip bonding in accordance with a preferred embodiment of the present invention.

A gold bump 200 is formed on a chip bond pad in a wafer, and thereafter, a die sawing is carried out to divide the wafer into respective chips.

A Cu pattern 202 and the gold bump 200 are aligned on a ceramic package 204 and then a bottom chip 206 is safely adhered to the ceramic package 204 in a thermal compression such that the bottom chip 206 is connected o the chip bond pad via the Cu pattern and the gold bump 200. The alignment of the Cu pattern 202 and the gold bump 200, which is marked as "A" in FIG. 2, is exemplified in FIG. 3.

Figure 3:
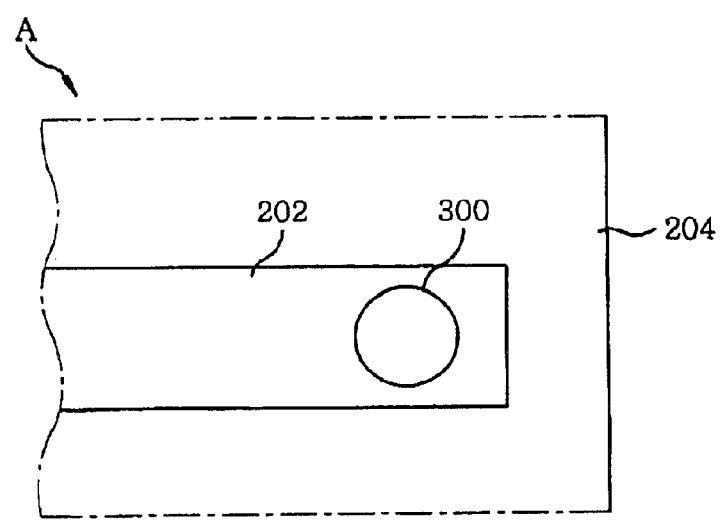
FIG. 3 represents a partially enlarged cross-sectional plan view for illustrating an alignment of a Cu pattern and a gold bump in the ceramic packaging process shown in FIG. 2

Referring to FIG. 3, the Cu pattern 202 is laid on the ceramic package 204 and then a gold planting is carried out with respect to the Cu pattern 202 in order to increase an adhesive strength between the Cu pattern 202 and the gold bump 200. Further, a groove 300 is formed in the Cu pattern 202 to safely attach the gold bump 200.

Subsequently, an top chip 208 is adhered to a backside of the bottom chip 206 by using an adhesive 210, e.g., epoxy, polymide tape or the like. Thereafter, the top chip 208 is connected to the chip bond pad via the Cu pattern 202 and the gold bump 200 similarly as in the lower chip 206. Accordingly, an interconnection between the bottom chip 206 and the top chip 208 is achieved.

Thereafter, the resultant construct is encapsulated by an insulating epoxy resin 212 to protect the interconnected portions against external environment and the insulating epoxy resin 212 is cured to completed a package assembly.

Meanwhile, a heat emitter 214 is installed at a bottom portion of the ceramic package 204, i.e., a location where the bottom and the top chips 206 and 208 are faced, in order to emit heat generated from the bottom and the top chips 206 and 208.

As described above, in accordance with the present invention, a groove is formed in a ceramic package and a bottom chip is safely adhered to the groove. Then the bottom and an top chip are respectively adhered to a Cu pattern via a gold bump in a thermal compression. Therefore, an interconnection using a gold bump is also carried out between the top chip and the bottom chip, thereby completing a packaging process.

Accordingly, a packaging space can be minimized because a Cu pattern instead of an existing DIP type lead frame is used in packaging a semiconductor device. Further, an electrically connected distance between a chip bond pad and a chip is minimized, thereby increasing operational characteristics of the semiconductor device while reducing manufacturing cost thereof. Moreover, since an epoxy molding compound is used for protecting the chip against external environment, an environmental pollution by wastes of the epoxy molding compound can be reduced.

While the invention has been shown and described with respect to the preferred embodiments, it will be understood by those skilled in the art that various changes and modifications may be made without departing from the spirit and scope of the invention as defined in the following claims.

What is claimed is:

1. A ceramic packaging method employing a flip-chip bonding, comprising the steps of:
   (a) forming a gold bump on a chip bond pad in a wafer;
   (b) dividing the wafer into a plurality of chips by a die sawing;
   (c) aligning a Cu pattern and the gold bump on a ceramic package and adhering a bottom chip to the ceramic package through the Cu pattern and the gold bump;
   (d) adhering a top chip to the bottom chip by using an adhesive, thereby forming a bottom/top chip structure of the bottom and top chip;
   (e) electrically connecting the chip bond pad to the bottom chip and the chip bond pad to the top chip by interconnecting the bottom and the top chips; and
   (f) encapsulating interconnected portions of the bottom and the top chips.

2. The method of claim 1, wherein a heat emitter is installed on a bottom portion of the ceramic package in order to emit heat generated from the bottom and the top chip.

3. The method of claim 1, wherein a groove is formed on the Cu pattern so that the gold bump is safely attached thereto.

4. The method of claim 1, wherein the adhesive is an epoxy or a polymide tape.

5. The method of claim 1, wherein a flip-chip bonding is carried out with respect to the top chip.

6. The method of claim 1, wherein the bottom and the top chip are electrically interconnected to each other by the Cu pattern.

7. The method of claim 1, wherein the interconnected portions are encapsulated by an epoxy resin.

* * * * *